(12) United States Patent
Hackler et al.

(10) Patent No.: US 7,398,812 B2
(45) Date of Patent: Jul. 15, 2008

(54) APPARATUS FOR THERMAL DEVELOPMENT HAVING A REMOVABLE SUPPORT MEMBER

(75) Inventors: Mark A. Hackler, Ocean, NJ (US); Dietmar Dudek, Langen, DE (US); William W. Early, Wilmington, DE (US); Anandkumar R. Kannurpatti, E. Windsor, NJ (US); Jeffrey Robert Lake, Pittsford, NY (US); Robert A. McMillen, Downingtown, PA (US); David B. Neufeglise, Pittsford, NY (US); Pier Luigi Sassanelli, Neu-Isenburg, DE (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 34 days.

(21) Appl. No.: 11/009,679

(22) Filed: Dec. 10, 2004

(65) Prior Publication Data

US 2005/0142494 A1    Jun. 30, 2005

Related U.S. Application Data

(60) Provisional application No. 60/533,711, filed on Dec. 31, 2003.

(51) Int. Cl.
*B32B 37/00*    (2006.01)
(52) U.S. Cl. .................... 156/499; 156/555; 156/556; 156/582
(58) Field of Classification Search ................ 156/358, 156/555, 556, 580, 581, 582, 583.1, 499, 156/538
See application file for complete search history.

(56) References Cited

U.S. PATENT DOCUMENTS

| | | | |
|---|---|---|---|
| 3,060,023 A | 10/1962 | Burg et al. | |
| 3,264,103 A | 8/1966 | Cohen et al. | |
| 4,323,636 A | 4/1982 | Chen | |
| 4,323,637 A | 4/1982 | Chen et al. | |
| 4,427,759 A | 1/1984 | Gruetzmacher et al. | |
| 4,460,675 A | 7/1984 | Gruetzmacher et al. | |
| 4,726,877 A | 2/1988 | Fryd et al. | |
| 4,753,865 A | 6/1988 | Fryd et al. | |
| 5,015,556 A | 5/1991 | Martens | |
| 5,175,072 A | 12/1992 | Martens | |
| 5,215,859 A | 6/1993 | Martens | |
| 5,262,275 A | 11/1993 | Fan | |
| 5,279,697 A | 1/1994 | Peterson et al. | |
| 5,506,086 A | 4/1996 | Van Zoeren | |
| 5,607,814 A | 3/1997 | Fan et al. | |
| 5,719,009 A | 2/1998 | Fan | |
| 5,766,819 A | 6/1998 | Blanchet-Fincher | |
| 5,840,463 A | 11/1998 | Blanchet-Fincher | |
| 6,773,859 B2 | 8/2004 | Fan et al. | |
| 6,797,454 B1 | 9/2004 | Johnson et al. | |
| 2003/0211423 A1 | 11/2003 | Mengel et al. | |
| 2004/0048199 A1 | 3/2004 | Schadebrodt et al. | |
| 2004/0242392 A1* | 12/2004 | Betti et al. ................ 492/28 |

FOREIGN PATENT DOCUMENTS

| | | |
|---|---|---|
| EP | 0 741 330 A1 | 11/1996 |
| WO | WO 98/13730 | 4/1998 |
| WO | WO 01/18604 A2 | 3/2001 |

* cited by examiner

*Primary Examiner*—James Sells
(74) *Attorney, Agent, or Firm*—Thomas H. Magee

(57) ABSTRACT

This invention pertains to a method and apparatus for thermally developing a photosensitive element, and particularly to a method and apparatus for supporting the photosensitive element with a removable flexible support member during thermal treatment.

14 Claims, 3 Drawing Sheets

APPARATUS FOR THERMAL DEVELOPMENT HAVING A REMOVABLE SUPPORT MEMBER

BACKGROUND OF THE INVENTION

1. Field of the Invention

This invention pertains to a method and apparatus for thermally developing a photosensitive element, and particularly to a method and apparatus for supporting a photosensitive element during thermal development.

2. Description of Related Art

Flexographic printing plates are well known for use in printing surfaces which range from soft and easy to deform to relatively hard, such as packaging materials, e.g., cardboard, plastic films, aluminum foils, etc. Flexographic printing plates can be prepared from photosensitive elements containing photopolymerizable compositions, such as those described in U.S. Pat. Nos. 4,323,637 and 4,427,759. The photopolymerizable compositions typically include an elastomeric binder, at least one monomer and a photoinitiator. Photosensitive elements generally have a photopolymerizable layer interposed between a support and a coversheet or multilayer cover element. Upon imagewise exposure to actinic radiation, polymerization of the photopolymerizable layer occurs in the exposed areas, thereby curing and rendering insoluble the exposed areas of the layer. Conventionally, the element is treated with a suitable solution, e.g., solvent or aqueous-based washout, to remove the unexposed areas of the photopolymerizable layer leaving a printing relief which can be used for flexographic printing. However, developing systems that treat the element with a solution are time consuming since drying for an extended period (0.5 to 24 hours) is necessary to remove absorbed developer solution.

As an alternative to solution development, a "dry" thermal development process may be used which removes the unexposed areas without the subsequent time-consuming drying step. In a thermal development process, the photosensitive layer, which has been imagewise exposed to actinic radiation, is contacted with an absorbent material at a temperature sufficient to cause the composition in the unexposed portions of the photosensitive layer to soften or melt and flow into an absorbent material. See U.S. Pat. No. 3,060,023 (Burg et al.); U.S. Pat. No. 3,264,103 (Cohen et al.);U.S. Pat. No. 5,015,556 (Martens); U.S. Pat. No. 5,175,072 (Martens); U.S. Pat. No. 5,215,859 (Martens); and U.S. Pat. No. 5,279,697 (Peterson et al.). The exposed portions of the photosensitive layer remain hard, that is do not soften or melt, at the softening temperature for the unexposed portions. The absorbent material collects the softened un-irradiated material and then is removed from the photosensitive layer. The cycle of heating and contacting the photosensitive layer may need to be repeated several times in order to sufficiently remove the flowable composition from the unirradiated areas and form a relief structure suitable for printing. After such processing, there remains a raised relief structure of irradiated, hardened composition that represents the irradiated image.

Processors for thermal development of flexographic printing elements are known. U.S. Pat. No. 5,279,697 describes an automated process and apparatus for handling an irradiated printing element and accomplishing repeated heating and pressing to remove the unirradiated composition from the element. The apparatus includes a preheating drum that has a clamp flush mounted transversely on an outer surface of the drum for securing a leading edge of the photosensitive element to the outer surface of the drum. The preheating drum is coated with a silicone rubber composition layer having a Shore A hardness rating between about 30 and 60. The rubber coating may be impregnated with aluminum particles.

WO 2001/18604 also describes a method and apparatus for thermal processing a photosensitive element. The apparatus includes a drum coated with a rubber composition or a thin tackification coating on a smooth metallic surface of the drum. The rubber coating provides a resilient surface that results in a longer nip zone as a result of the surface deflecting under the pressure exerted by a developing hot roller. The tackification coating temporarily adheres the photosensitive sheet element to the drum, and since no rubber layer is present, can improve the thermal conductivity between the drum and the photosensitive element.

In an embodiment of a thermal processor, commercially identified as CYREL® FAST 1000TD processor, an exterior surface of the drum includes a silicone rubber layer having a Shore A hardness of 50, and a tackification layer on the rubber layer. The tackification layer is DOW 236, a silicone dispersion in solvent, available from Dow Corning.

During thermal development, the photosensitive element is mounted on the drum with the element residing on the tacky layer. Unfortunately with use, the layer or layers on the surface of the drum can deteriorate and detrimentally impact the performance of the system. With use, the tackiness of the tacky coated surface decreases due to dirt collection and wear of the coating. The tacky layer can also be abraded away by the action of the absorbent material on a hot developer roll and the photosensitive element traversing through the nip. In some cases, the tacky layer is abraded to the underlying rubber layer. Insufficient tackiness of the tacky layer will not retain the photosensitive element, particularly a trailing end of the element, in place as the drum rotates the element through the developing cycle of heating the element and contacting with the absorbent material. If the photosensitive element is not appreciably held in contact with the drum, the element can rub against other parts of the processor and damage the relatively soft printing surface. Depending on the orientation of heating elements, the photosensitive element can possibly contact hot surfaces of the heating elements, resulting in damage to the photosensitive element, or the heating elements, or both.

The surface layer or layers can also crack or be cut by knives or other tools that are required on occasion. The photosensitive element can be damaged by large cracks or crevices in the surface layer since the element can be forced into the crevice due to the pressure exerted at the nip during development. The integrity of the drum coating can also be compromised. Smaller cracks can tend to grow into larger cracks due to the forces inherent in the nip.

In the event of any of the above problems with the surface layers on the drum, the entire drum must be replaced. Replacing the drum is expensive as well as a cumbersome process that requires lifting equipment to remove the existing drum from the apparatus. Additionally, the apparatus is not operational for several hours to a few days, resulting in downtime for the customer.

So a problem arises with the quality of the layer or layers on the surface of a development drum used in thermal development of photosensitive elements. With use, the layer or layers on the drum can become worn and/or damaged which can impact the thermal development system performance.

SUMMARY OF THE INVENTION

The present invention provides a method for forming a relief pattern from a photosensitive element having an exterior surface and containing a composition layer capable of being partially liquefied. The method comprises supplying an absorbent material to the exterior surface with a first member; supporting the photosensitive element with a flexible support member removably mounted on a base member to deliver the photosensitive element to the absorbent material; heating the exterior surface to a temperature Tr sufficient to cause a portion of the layer to liquefy; and contacting the photosensitive element with the absorbent material to allow at least a portion of the liquefied material of the composition layer to be absorbed by the absorbent material.

The invention also provides an apparatus for forming a relief pattern from a photosensitive element having an exterior surface and containing a composition layer capable of being partially liquefied. The apparatus comprises means for supplying an absorbent material to the exterior surface; a base member mounted in a frame portion and positioned for delivering the photosensitive element to the absorbent material, wherein at least one of the means for supplying and the frame portion are movable relative to the other; a flexible support member removably mounted on the base member; means for heating the exterior surface to a temperature sufficient to cause a portion of the layer to liquefy; and means for contacting the photosensitive element and the absorbent material to allow at least a portion of the liquefied material of the composition layer to be absorbed by the absorbent material

DESCRIPTION OF THE PREFERRED EMBODIMENT(S)

Figure 1:
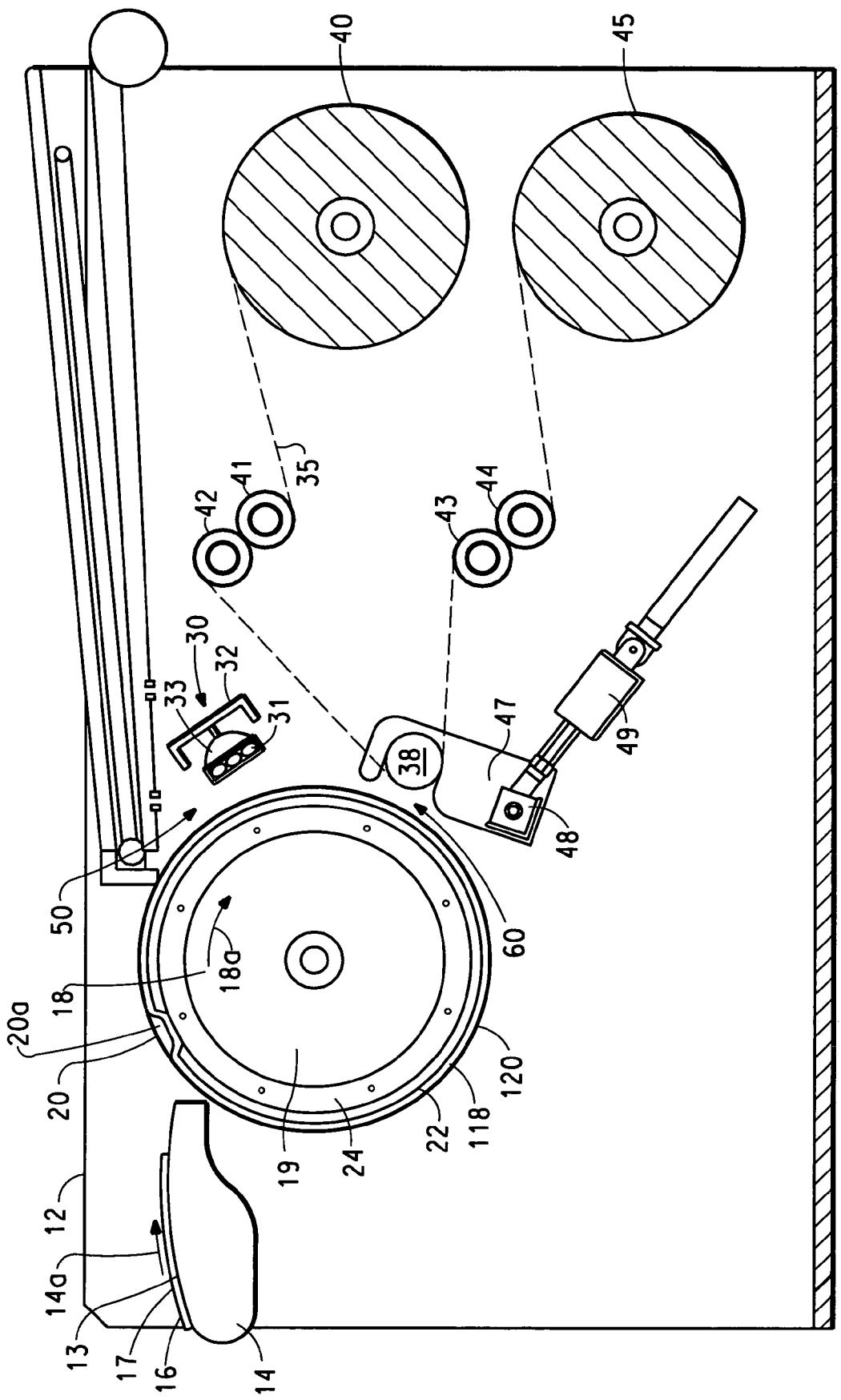
FIG. 1 is a schematic cross-sectional side view of a thermal development apparatus depicting one embodiment of the present invention for a flexible support member removably mounted on a base member that is a drum.

Throughout the following detailed description, similar reference characters refer to similar elements in all figures of the drawings.

The present invention is an apparatus and process for thermally developing a photosensitive element, preferably to form a flexographic printing plate. The present invention contemplates an apparatus capable of heating a photosensitive element having a layer of composition capable of being partially liquefied to a temperature sufficient to melt or soften or liquefy at least a portion of the layer for any purpose. In particular, the present invention relates to an apparatus and process for supporting the photosensitive element during thermal development.

Thermal development heats the photosensitive element to a development temperature that causes uncured portions of the composition layer to liquefy, i.e., melt or soften or flow, and be carried away or removed by contact with a development medium. The development medium may also be referred to herein as development material, absorbent material, absorbent web, and web. Cured portions of the photosensitive layer have a higher melting or softening or liquefying temperature than the uncured portions and therefore do not melt, soften, or flow at the thermal development temperatures. Thermal development of photosensitive elements to form flexographic printing plates is described in U.S. Pat. No. 5,015,556; U.S. Pat. No. 5,175,072; U.S. Pat. No. 5,215,859; and WO 98/13730. The photosensitive element includes a substrate and at least a composition layer mounted on the substrate. The composition layer is capable of being partially liquefied.

The term "melt" is used to describe the behavior of the unirradiated portions of the composition layer subjected to an elevated temperature that softens and reduces the viscosity to permit removal by the development medium. The material of the meltable portion of the composition layer is usually a viscoelastic material which does not have a sharp transition between a solid and a liquid, so the process functions to absorb the heated composition layer at any temperature above some threshold for absorption in the absorbent material. Thus, the unirradiated portions of the composition layer soften or liquefy when subjected to an elevated temperature. However throughout this specification the terms "melting", "softening", and "liquefying" may be used to describe the behavior of the heated unirradiated portions of the composition layer, regardless of whether the composition may or may not have a sharp transition temperature between a solid and a liquid state. A wide temperature range may be utilized to "melt" the composition layer for the purposes of this invention. Removal by the development medium encompasses absorption by the development medium that can be considered an absorbent material. Removal may be slower at lower temperatures and faster at higher temperatures during successful operation of the process.

An apparatus suitable for thermally developing the photosensitive element is disclosed by U.S. Pat. No. 5,279,697, and also by Johnson et al. in Patent Cooperation Treaty Publication No. WO 01/18604 A2. U.S. Pat. No. 5,279,697 shows two embodiments in which the photosensitive element is placed on a planar surface for thermal treatment. Both patent publications show a drum supporting the photosensitive element for thermal treatment. The photosensitive element in all embodiments is in the form of a plate. It should be understood that one of ordinary skill in the art could modify each of the disclosed apparatuses to accommodate the mounting of the photosensitive element in the form of a cylinder or a sleeve.

FIG. 1 shows a first embodiment of a thermal processor 10. A drum 18 acting as a base member 19 is mounted for rotation on a stationary support frame 12 and rotates in a counterclockwise direction as indicated by arrow 18a. The base member 19 is non-flexible or substantially non-flexible such that the base member 19 does not significantly change shape during the thermal development process. A photosensitive element 16 is placed on a surface 13 of feed tray 14 and is urged in a direction indicated by arrow 14a. The drum 18 includes a clamp 20 that captures a leading edge of the photosensitive element 16 to mount the element 16 onto the drum.

The clamp 20 and clamp assembly are described in WO 01/18604 A2, particularly relative to FIGS. 1 through 5. The clamp 20 is flush mounted transversely on an exterior surface 22 of the drum 18. A cross-section of a tooth of the clamp 20 traversing a recessed area 20a is shown in FIG. 1. In one embodiment, the clamp 20 is elongated and has a plurality of teeth extending tangentially in a direction opposite the direction of rotation 18a of the drum 18. In one embodiment, the clamp 20 extends the full width of the element 16. In operation, the clamp 20 is raised radially outward and off of the exterior surface 22 of the drum 18 by an actuator means. The actuator means can be a pair of pneumatic cylinders mounted into the frame 12 and positioned on opposite ends of the drum 18. The pneumatic cylinders are mounted radially and each has an end with a stop that exerts a radial force away from the axis of rotation 18a of the drum 18. The clamp assembly including the actuator means lift the clamp 20 to a height sufficient to provide enough clearance for inserting the leading edge of the element 16 between the clamp 20 and the recessed area 20a for the clamp 20 on the drum 18. The clamp assembly retracts the clamp 20 to tightly grip the leading edge of the element 16 and hold the element 16 in place on the drum 18.

In the present invention, a support member 118 is mounted onto the exterior surface 22 of the drum 18 in order to support the photosensitive element 16 during thermal development. The drum 18, as the base member 19 is a cylindrically-shaped support for the support member 118. In one embodiment, the support member 118 contacts the exterior surface 22, e.g., metal, of the drum 18. Thermal conductivity between the drum surface and the support member 118 is greater when the exterior surface 22 of the drum 18 does not include any surface coatings or layers so long as the support member is in sufficient contact with the drum. It is possible that the exterior surface 22 of the drum 18 can include one or more layers of material to accommodate various operating conditions that may be necessary for thermal development of various photosensitive elements 16. The support member 118 is flexible such that the member 118 conforms to the shape of the underlying base member 19, which in this embodiment is the drum 18. As such, the flexible support member 118 forms an outer circumferential surface 120 for supporting the photosensitive element 16 through heating of the element 16 and for delivering the element to a development material 35. The element 16 remains substantially in contact with the outer surface 120 of the support member 118 during processing.

Figure 2A:
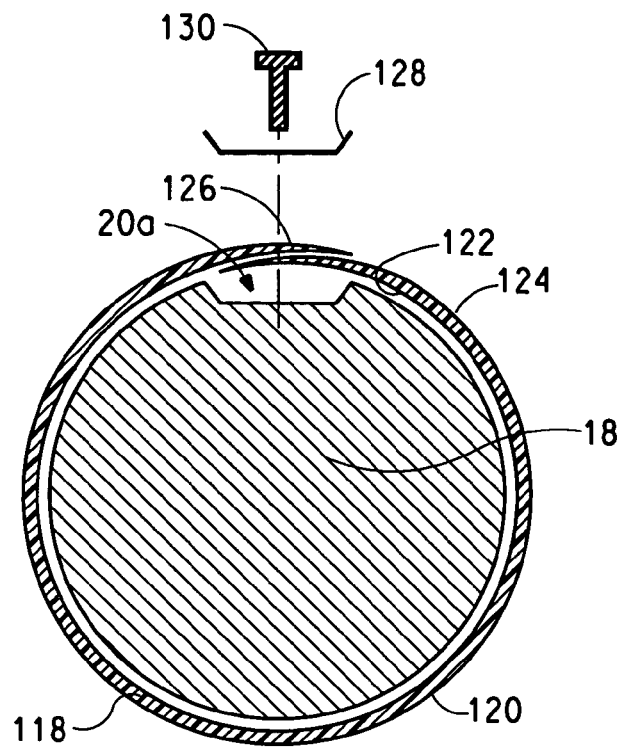
FIG. 2a is a schematic cross-sectional side view of an embodiment of the support member of the present invention.
Figure 2B:
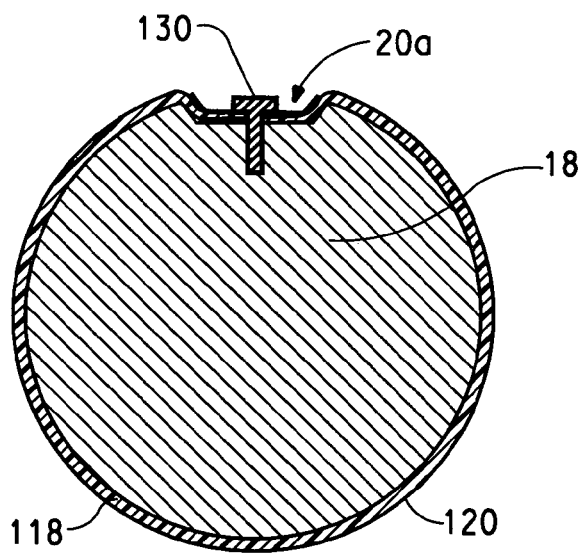
FIG. 2b is a schematic cross-sectional side view of the support member of the present invention in tension on the base member.

The flexible support member 118 includes a carrier 122 and may have at least one layer 124 of material applied to one or both sides of the carrier. In one embodiment where the carrier 122 includes the layer on one side, the support member 118 is mounted to the drum 18 such that a side of the carrier 122 opposite the layer/s 124 is adjacent the exterior surface 22 of the drum 18. As shown in FIGS. 2a and 2b, the support member 118 has a length suitable to wrap about the exterior surface 22 of the drum 18 such that two opposite ends 126 of the support member 118 mate or overlap for secure mounting to the drum 18. At each end of the opposite ends 126 of the support member 118 is a plurality of openings (not shown) that mate when the opposite ends 126 are overlapped. A bar member 128 also having a plurality of openings to mate with the openings in the ends 126 secures and tensions the support member 118 to the drum 18. Fasteners, such as bolts 130, are located through the openings in the bar member 128 and then through the mated openings in the support member 118 and secured into a recessed area 20a for the clamp 20 on the drum 18. The bar member 128 can be the same or substantially the same length as an axial length of the drum 18. In one embodiment, the bar member 128 is about 2 inches shorter than the axial length of the drum 18 and support member 118 and is shaped to fit into the recessed area 20a for the clamp 20. As shown in FIG. 2b, when the fasteners or bolts 130 are secured into the drum 18 the bar member 128 tightens the support member 118 about the circumference of drum thereby tensioning the support member 118 into contact with the exterior surface 22 of the drum 18. The support member 118, bar member 128, and the bolts 130 are located within the recessed area 20a so as not to interfere with the clamp 20 and clamp assembly that holds the leading edge of the photosensitive element 16. This location also precludes their interference with the hot roll 38 or nip 60. For example, the fasteners or bolts 130 (and openings) are located between teeth of the clamp 20. The clamp 20 is thus still able to function when the support member 118 is secured to the drum 18. In an alternate embodiment, the two ends 126 of the flexible support member 118 can be held together with one bar member and a second bar member can be used to attach the support member 118 to the drum 18.

When the support member 118 is tensioned to the drum 18, heat transfer between the drum, support member including any layers 124 present on the carrier 122 is promoted. It is contemplated to be within the skill of those in the art to design alternate embodiments for securing in tension the support member 118 to the exterior surface 22 of the drum 18 in addition to the described embodiment depicted in FIGS. 2a and 2b. In one alternate embodiment contemplated a drum would include an axial slot to accommodate an end of the support member, and a clamp for the opposite element of the support member would be tightened to tension the support member to the drum. Another alternate embodiment contemplated would use snug-fitting bands around and at the axial ends of the drum which retain the support member to the drum.

The support member 118 has a width (side-to-side) that covers or substantially covers an entire width of the drum 18. In one embodiment, tensioning the support member 118 to the drum 18 is sufficient to retain the support member to the drum without the need to secure each side of the support member to the exterior surface 22 of the drum as well. It may be desired to attach the sides of the support member 118 to the drum 18 by any means conventional in the art to secure the support member in place, but yet maintain the capability to remove the support member as needed.

The carrier 122 can be made of any material having suitable thermal conductivity and mechanical strength to function in the present thermal development process. The material for the carrier 122 should also be one that can adhere a layer 124 of a modification material. In one embodiment, the carrier 122 is metal, preferably aluminum, but can also be made of stainless steel, galvanized steel, or other metals. Other materials suitable for use as the carrier 122 include a polymeric film, such as polyester and polyimide; fiber reinforced polymeric film; and composite materials. In addition to the above characteristics, the carrier 122 should be dimensionally stable and resistant to heat associated with the present thermal development process. In the embodiment shown the carrier 122 is in sheet form. Alternatively the carrier 122 can be in a cylindrical form, such as for example, a print sleeve, which can be mounted with on the drum 118 or a roll in the same way or similar to the mounting of a printing sleeve or a bridge sleeve onto a printing cylinder. The drum 18 or roll would include radial passages for supplying air to its outer surface. The air at the outer surface of the drum 18 or roll creates a cushion that expands the cylindrically-shaped carrier 122 to the extent that the carrier can slide along about a longitudinal axis of the drum. Once the carrier 122 is in position on the drum 18, the air supply is turned off and the carrier contracts to have an interference fit with the drum 18. This process can be reversed for removal of the cylindrically-shaped carrier 122 from the drum 18, or in some instances the carrier 122 can simply be cut off the drum.

It is preferred that the carrier 122 includes on one side at least one layer 124 of a modification material. The at least one layer 124 of material can be a resilient layer, or a tacky layer, or a resilient layer and a tacky layer on the resilient layer, or a single layer that provides both resiliency and tackiness. The tacky layer can also function as a protective layer to an underlying resilient layer. Alternatively, a protective layer can be interposed between the resilient layer and the tacky layer. The resilient layer can be composed of any material to suitable to provide a Shore A hardness between about 30 and about 75, such as natural rubbers and elastomeric materials and synthetic rubbers and elastomeric materials, including rubber, silicone rubber, and compressible foams. Particularly preferred are silicone rubber and rubber. The hardness of the layer 124 is important, although not critical to the invention. The resilient surface provided by the resilient layer can result in a longer nip zone as a result of the surface deflecting under the pressure exerted by the hot roll 38. The rubber elasticity also accommodates some minor misalignment between the drum 18 and a hot roll 38. The resilient layer can include metal particles, such as aluminum particles, to improve the heat transfer characteristics of the support member by between 10-20 percent.

The tacky layer can be of any suitable material in order to provide the necessary adhesiveness to retain the photosensitive element on the support member 118 as the drum 18 rotates, and yet allow for the release of the element from the drum after development is completed. A test can be conducted to determine if a surface has tackiness suitable for use in the present invention. A suggested test involves placing a relatively small portion (about 3 in.×3 in., about 7.6 cm×7.6 cm) of a photosensitive element onto the tacky surface of the support member 118 positioned on the drum 18, orienting the drum so that gravity will tend to pull the portion off the support member 118, and determining the time the portion remains on the tacky surface. If the portion remains on the support member 118 for at least 3 seconds while gravity oriented, the surface is suitably tacky for use in the present invention. The tackiness of the tacky layer is relatively low, that is, the plate 16 should be easily removeable from the drum 18 after development, unlike removal of a printing plate adhesively mounted onto a printing cylinder. In addition to the tacky layer having a releasable adhesiveness for the photosensitive element, the selection of the material for the tacky layer may also be driven by the selection of the material for the underlying layer. The tacky layer must adhere to the underlying resilient layer, or an underlying protective layer on the resilient layer, or even the carrier layer. When the underlying resilient layer is silicone rubber, a preferred material for the tacky layer is a silicone-based material, such as Dow Corning 236 dispersion.

It is contemplated that the carrier 122 may also have one or more additional layers on the opposite side of the sheet. The layer or layers on the opposite side may have the same purpose as the layer/s 124 on the one side of the sheet. As such, the support member 118 having the same layer/s 124 on each side is reversible and can be flipped over for use before being discarded. The layer or layers on the opposite side may be useful for other purposes such as improving the heat transfer between carrier and drum surface, maintaining the position of the carrier for mounting or during operation with for example, an adhesion layer, to avoid shifting or lifting of the carrier, cushioning the element 16. However, the more layers present on the carrier 122, the more difficult it may be to maintain thermal transfer conditions between the base member 19 and the support member 118 to the photosensitive element 16. It is also contemplated that more than one flexible support members 118 may be mounted to the base member 19. Each of the more than one flexible support members 118 may be the same or different relative to layer 124 and carrier 122.

The layer or layers 124 can be applied to the carrier 122 in any manner suitable to provide the necessary coverage of the modification material or materials on the support member 118. A conventional method for applying a silicone rubber as the resilient layer includes extruding the rubber to form a layer on the carrier, heating in an autoclave to cure the rubber, and then grinding an exterior surface of the rubber to the desired layer thickness. Alternatively, a calendered rubber sheet layer may be laminated to the carrier and then coated with the material to form the tacky layer. The tacky layer can be spray coated onto the resilient layer. The thickness of the carrier 122 is between 0.005 to 0.250 in. (0.0127 to 0.635 cm), preferably 0.015 to 0.025 in. (0.038 to 0.064 cm). The thickness of the resilient layer on the carrier is 0 to 0.750 in. (0 to 1.91 cm), preferably 0.10 to 0.30 in. (0.25 to 0.76 cm). The thickness of the tacky coating is 0 to 0.050 in. (0 to 0.127 cm), preferably 0.003 to 0.013 (0.008 to 0.33 cm).

In an alternate embodiment of this invention it is contemplated that the flexible support member 118 need not include a carrier 122, and can be formed with a layer of self-supporting material, such as a compressible material. The layer of compressible material can be made from any of the materials identified for the resilient layer, provided that the compressible material has sufficient strength to be securely mounted to the base member 19. One or more modification layers as described above can be included with the layer of compressible material.

In operation, the flexible support member 118 with the base member 19 function as a unitary structure to support the photosensitive element 16 during thermal development. Yet the flexible support member 118 is capable of being removed from the base member 19 as needed primarily for maintenance of the processor 10, and particularly to replace the support member 118 or one or more of the layers 124 on the support member 118. In the present invention, the support member 118 by its removability from the base member 19, separates the function of the layer or layers 124 from the function of the base member 19 to deliver the photosensitive element 16 to the development material 35. The removable support member 118 provides for the replacement of the modification layer/s 124 on the carrier 122 as the layer/s become worn with use. It should be understood that when the support member 118 is removed from the base member 19 in the embodiment where the base member 19 is the drum 18, the drum itself including the exterior surface 22 forming the drum cylinder remains intact.

The present invention offers several advantages in that the flexible support member 118 provides for a removable surface for the drum or a planar support that allows for quick and easy replacement of a worn or damaged surface in order to maintain good processor performance. It is substantially less expensive and time consuming to replace the support member 118 than to replace the entire drum 18. Further, the initial installation of a drum 18 into a thermal processor 10 is facilitated because the drum can be installed without concern for damaging one or more layers 124 on the drum surface 22. The support member 118 can then be easily installed to the exterior surface 22 of the drum 18 after the drum is installed.

Thermal development includes heating of an exterior surface 17 of the photosensitive element 16 to a temperature sufficient to cause a portion of the composition layer to liquefy. The composition layer may also be identified as a photopolymerizable layer. The photosensitive element 16 containing the composition layer (and any additional layer/s if present) can be heated by conduction, convection, radiation or other heating methods to a temperature sufficient to effect melting, softening, or liquefying of the uncured portions but not so high as to effect distortion of the cured portions of the layer. One or more additional layers disposed above the composition layer may soften or melt or flow and be removed as well by the development medium. The photosensitive element is heated to a surface temperature above about 40° C., preferably from about 40° C., to about 230° C. (104-446° F.) in order to effect melting or flowing of the uncured portions of the composition layer. The thermal treating steps of heating the photosensitive element 16 and contacting an outermost surface of the element with the development medium can be done at the same time, or in sequence provided that the uncured portions of the composition layer are still soft or in a melt state when contacted with the development medium.

The drum 18 may also be equipped with a heater 24, which is provided to keep the photosensitive element 16 at a stable starting temperature independent of the surrounding environment. Any means of heating the drum 18 is acceptable, as long as the power capacity of the heater is sufficient to maintain a fairly constant selected skin temperature on the exterior surface 22 of the support member 118 mounted on the drum 18. The means for heating the drum is capable of heating the drum 18 to a temperature capable of heating the exterior surface 17 of the composition layer. The heater 24 may be an electrical heating blanket, such as a wire wound blanket. If the normal operating environment is carefully controlled to be at a constant temperature, the heater can be turned off or omitted from the apparatus. As is disclosed in WO 2001/18604, it is also possible that the drum be cooled by cooling means, such as, a blower directing a stream of air at the surface of the photosensitive element and the drum and/or by the circulating of cooling fluid beneath the surface of the drum 18 to cool the element 16. It should be understood that such cooling means could also cool the support member 118. It is also contemplated that a heating fluid, such as water, may be circulated beneath the surface of the drum 18 to heat the element 16. The temperature of the exterior surface 22 of the support member 118 mounted on the drum is about 50 to 150° F. (10 to 65.6° C.), preferably 75 to 95° F. (23.9 to 35° C.).

Located adjacent the drum 18 is a first heating means comprising a heater 30 which, in the embodiment illustrated, is a focused radiant heater directed at an exterior surface 17 of the photosensitive element 16. The heater 30 elevates the temperature of the exterior surface 17 of the composition layer. In one embodiment, the heater 30 elevates the temperature of the surface 17 of the composition layer to a temperature sufficient to melt or soften the unirradiated portion of the composition layer, causing a portion of the layer to liquefy. The heater 30 applies heat to the exterior surface 17 of the composition layer. In the embodiment illustrated, the heater 30 comprises a plurality of tubular infrared heating bulbs, such as bulbs 31 mounted in end supports, such as support 32, that also provide electrical connections to the bulbs 31. Adjacent the side of the bulbs 31 opposite drum 18 is a reflector 33 that acts to focus and direct the infrared radiation toward the exterior surface 17 of the photosensitive element sheet 16. An alternate embodiment of the heater 30 uses one tubular infrared heating bulb 31 mounted in the end supports 32 with the reflector 33.

The thermal processor 10 includes a delivery means for feeding a continuous web 35 of the development material, which in the preferred embodiment contacts a hot roller 38. A second means for heating includes the hot roller 38. The hot roller 38 is positioned adjacent the drum 18 which carries the photosensitive element 16. The hot roller 38 is also adjacent the heater 30, and the hot roller 38 maintains or further elevates the temperature of the exterior surface 17 of the composition layer. The hot roller 38 applies heat to the exterior surface 17 of the photosensitive element 16. The absorbent web 35 is unwound from a supply roll 40 and passes between rolls 41 and 42 in a serpentine path. The web 35 is then guided over the hot roller 38 and over rolls 43 and 44. One or more of the rolls 41, 42, 43, 44, as well as take up roll 45 may drive the web 35. One or more of the rolls 41, 42, 43, 44, and even the supply roll 40 may include a braking mechanism to maintain tension of the web in its transport path. The web 35 is then wound up on the take up roll 45.

The processor 10 is provided with a means for relative motion between the drum 18 and the hot roller 38, so that the photosensitive element 16 and the web 35 of development material can be brought into contact with the other. Means for providing relative movement can be accomplished, for example, by mounting the hot roller 38 (and/or drum 18) onto arms 47 attached to a beam 48 that moves the hot roller 35 under the urging of one or more actuators 49. Suitable for use as one or more actuators 49 can be air cylinders, or stepping motors, or servo motors. Temperature sensors may be mounted throughout the processor to monitor the temperature for the purpose of controlling the heating elements in the drum 18, hot roller 38, and radiant heater 30.

The nip 60, or distance between the hot roller 38 and the drum 18, when the hot roller 38 is in the engaged position for this embodiment, is zero centimeters. It is desirable to set the distance such that a substantially uniform pressure is applied to the nip area of the exterior surface of the sheet 16 during processing. Pressure is applied to force the absorbent web into intimate contact with the photosensitive element 16. Pressure between about 0.70 kilograms per square centimeter and about 24 kilograms per square centimeter, preferably between about 2 kilograms per square centimeter and about 12 kilograms per square centimeter in the nip area is adequate to enhance the absorption from the sheet surface to the absorbent web without distorting the composite photosensitive element.

The radiant heater 30 acting as a first heating means, the hot roller 38 acting as a second heating means, and the drum heater 24 acting as a third heating means, independently or in any combination, are capable of heating the exterior surface 17 of the photosensitive element 16 to a temperature sufficient to cause a portion, i.e., an unirradiated portion, of the composition layer to liquefy. The first heating means, the second heating means, and the third heating means independently or in any combination constitute a heating station 50. A preferred heating station 50 includes the first heating means and the second heating means.

The operation of the apparatus for the process of thermally developing the photosensitive element 16 is described in reference to FIG. 1. The plate processor 10 is in a home position with the drum 18 stationary with the clamp 20 positioned near the top of the drum adjacent the feed tray 14. The support member 118 was previously mounted onto the exterior surface 22 of the drum 18. The operator places the photosensitive element 16 on feed tray 14. An operator then opens clamp 20 and engages the leading edge 24 of the element 16 in clamp 20. The drum heater 24 or the IR heater 30 may be used to preheat the drum 18. The cartridge heater (not shown) for the hot roll 38 is used to preheat the hot roll. The drum 18 starts turning and carries the element 16 with it so that the photosensitive element 16 is adjacent the support member 118. The heater 30 may preheat the bulbs 31 before the element 16 reaches the heater 30, and then switch to an operating setting to achieve the desired temperature for melting, softening or liquefying the composition layer on the element 16. As the leading edge of the element 16 reaches the position where the hot roll 38 will contact the drum 18, the actuators 49 move the hot roll 38 carrying the absorbent web 35 against the element 16. The photosensitive element composition layer is heated to between 40 and 230° C. (104 and 392° F.) while in contact with the development medium. The development medium contacts the exterior surface of the composition layer of the heated photosensitive element 16, and absorbs the liquefied portions of the polymer from the unirradiated portions of the composition layer, forming a relief pattern or surface suitable for use as a flexographic printing form. By maintaining more or less intimate contact of the absorbent material development medium with the composition layer that is molten in the uncured regions, a transfer of the uncured photosensitive material from the composition layer to the development material takes place. While still in the heated condition, the development material is separated from the cured photosensitive element 16 to reveal the relief structure.

As the trailing edge of the element 16 passes the hot roll/drum contact point, i.e., nip, the heater 30 may cool down or turn off, the actuator 49 will retract the hot roll 38, and the web 35 will be stopped. The drum 18 may return the leading edge of the element 16 to the home position to begin another cycle of heating and contacting. A cycle of the steps of heating the element 16 to liquefy the composition layer and contacting the molten (portions) layer with the development material can be repeated as many times as necessary to adequately remove the uncured material and create sufficient relief depth. However, it is desirable to minimize the number of cycles for suitable system performance, and typically the photopolymerizable element is thermally treated for 5 to 15 cycles. Intimate contact of the development material to the composition layer (while the uncured portions are melting or liquefying) may be maintained by the pressing the layer and the development material together.

Figure 3:
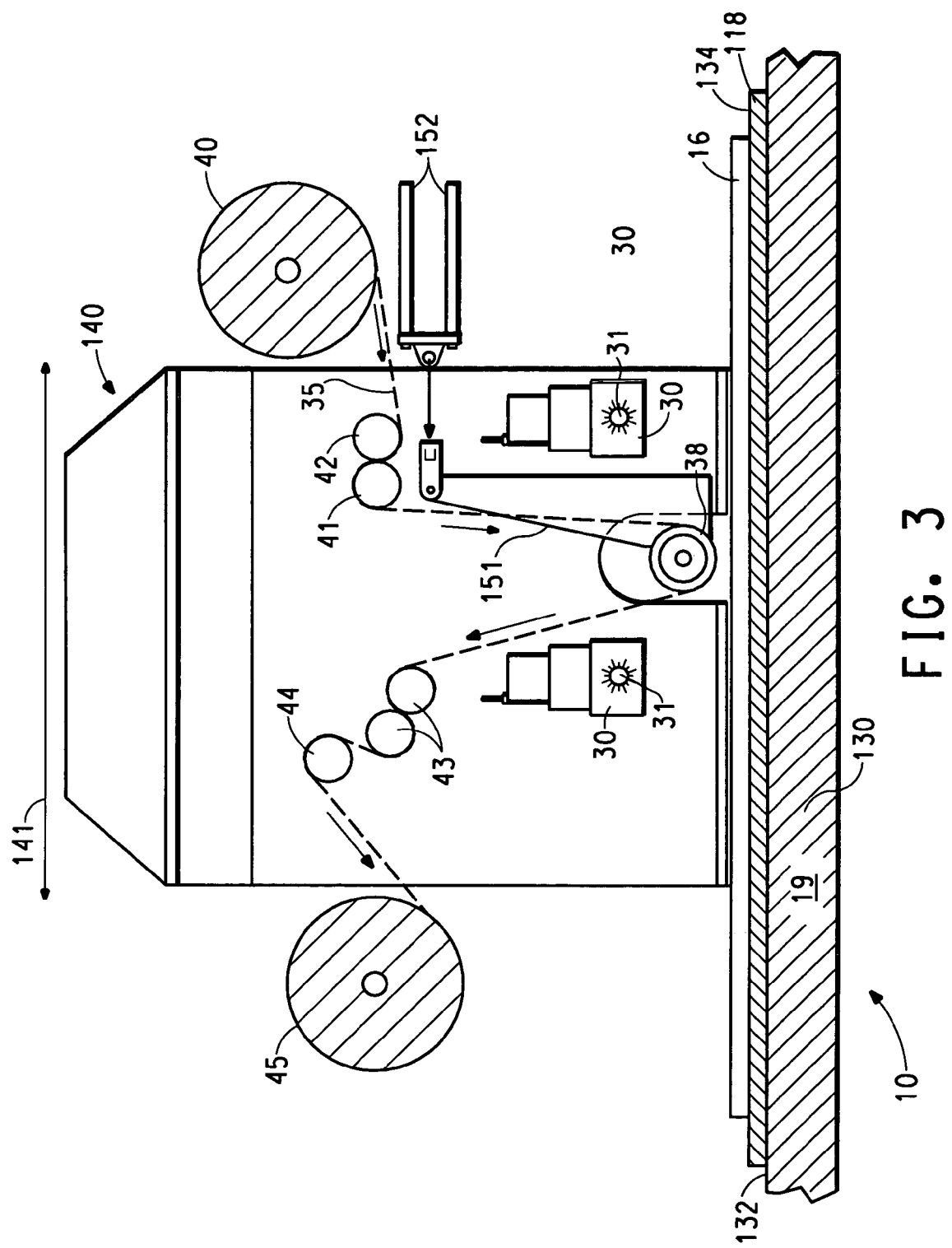
FIG. 3 is a schematic cross-sectional side view of a thermal development apparatus depicting another embodiment of the present invention for a flexible support member removably mounted on a base member that is a table.

FIG. 3 shows a second embodiment of a thermal processor 10. In this embodiment the base member 19 is a planar support 130 such as a tabletop or platen. The planar support 130 has an exterior surface 132 onto which is mounted a support member 118 for supporting the photosensitive element 16 during thermal development. Similar to the drum 18, the planar support 130 may be equipped with a heating means and/or a cooling means to control the temperature of the exterior surface 132 in order to maintain the photosensitive element 16 at a desired temperature. The surface 132 of the planar support 130 may optionally include one or more layers of material that would be adjacent the support member 118 similar to that described for the first embodiment. The flexible support member 118 has an outer surface 134 on which the photosensitive element 16 resides for supporting the element 16 through heating and delivering of the element 16 to the development material 35.

As is described above for the first embodiment of the processor 10, the flexible support member 118 includes a carrier 122 and may include at least one layer 124 of material applied to one or both sides of the carrier. The support member 118 useful for the second embodiment of the processor 10 may be the same as, similar to, or different from the support member 118 useful for the first embodiment of the processor 10. (However, the support member 118 for the second embodiment will still reside within the above description for the support member 118.) The support member 118 is removably mounted to the planar support 130. Although not shown in FIG. 3, the support member 118 is mounted to the planar support 130 with fasteners through openings at ends of the carrier 122 that mate with openings in the surface 132 of the planar support 130. Alternatively, the support member 118 may be removably mounted with a bar or bars that capture the ends of the support member 118 and are secured via fasteners through openings in the bars that mate to the openings in the surface 132 of the planar support 130. The flexible support member 118 is thereby tensioned to the base member 19. The photosensitive element 16 may be held in place on the support member 118 with one or more clamps (not shown) located on the base member 19 and positioned at one or both edges of the element 16. Typically, only one edge of the photosensitive element 16 is secured by the appropriate clamp or clamps during thermal development, depending upon the direction of movement of a sledge assembly.

This embodiment of the processor 10 includes a sledge assembly 140 which traverses the base member 19 carrying the development material 35 across the exterior surface of the photosensitive element 16 during thermal development. The sledge assembly 140 traverses the planar support 130 in two directions (to and fro) as indicated by arrow 141. Mounted in the sledge assembly 140 are the hot roller 38, the radiant heaters 30 comprising infrared heaters 31, and one or more web guide rolls 41, 42, 43, 44. The hot roller 38 is rotatably mounted in the sledge assembly 140 and positioned adjacent the planar support 130. The processor 10 is provided with means for relative motion between the hot roller 38 and the planar support 130 so that the absorbent web 35 supported by the hot roller 38 is contacted to the photosensitive element 16. In the embodiment shown in FIG. 3, means for relative motion is accomplished by swing arms 151 actuated by air cylinders 152 to move the hot roller 38 toward the photosensitive element 16. A swing arm 151 is connected at each end of the hot roller 38 (only one swing arm 151 is shown in FIG. 3). An upper end of the swing arm 151 that is opposite the hot roller 38 is connected to the air cylinders 152. To bring the hot roller 38 into contact position with the photosensitive element 16, the air cylinders 152 are actuated moving the upper end of the swing arm 152 and rotating the swing arm 152 counter-clockwise about a pivot point located near the end of the swing arm at the hot roller, thereby moving the hot roller vertically into contact position. Alternate means for relative motion are contemplated and include a servo motor or stepping motor to lower the hot roller 38 to a predefined position.

The delivery means for feeding a web 35 of the development material to the hot roller 38 may be mounted on the sledge assembly 140 (as shown in FIG. 3). The absorbent web 35 is unwound from a supply roll 40, passing around tracking rollers 41, 42 directing the web 35 under the hot roller 38 so that the web 35 resides between the hot roller 38 and the exterior surface of the photosensitive element 16. The web 35.path then passes around additional tracking rollers 43, 44 to windup on a take up roll 45.

In operation, the second embodiment of the processor 10 for thermally developing the sledge assembly 140 starts at one end of the planar support 130. The photosensitive element 16 is placed on the flexible support member 118 residing on the planar support 130, and the edge of the photosensitive element 16 that is nearest the starting position of the sledge assembly 140 is secured by the clamp. The photosensitive element 16 may be preheated with the radiant heater 30 and/or the heater associated with the planar support 130. The hot roller 38 may also be preheated. Any one or a combination of the radiant heater 30, the heater for the planar support 130, and the heater for the hot roller 38 may be used to heat the composition layer to a temperature sufficient to cause a portion of the layer to liquefy. The hot roller 38 is moved toward the photosensitive element 16 by the actuating the air cylinders 152 to move the swing arm 151 and thus the hot roller 38 thereby carrying the web 35 of development material to contact with the exterior surface of the element 16. Intimate contact of the absorbent web 35 to the photosensitive element 16 may be maintained by pressing the element and the absorbent web together. The sledge assembly 140 traverses the planar support 130 rotating the hot roller 38 from the starting (leading) edge to the trailing edge of the photosensitive element 16. The photosensitive element composition layer is heated to between 40 and 230° C. (104 and 392° F.) while in contact with the development material. The development material contacts the exterior surface of the composition layer of the heated photosensitive element 16, and absorbs the liquefied portions of the polymer from the unirradiated portions of the composition layer, forming a relief pattern or surface. By maintaining more or less intimate contact of the development material with the composition layer that is softened in the uncured regions, a transfer of the uncured material from the photopolymerizable layer to the development material occurs. As the sledge assembly 140 traverses the hot roller 38, the absorbent web 35 is separated from the photosensitive element 16 while the element is still in the heated condition. After the sledge assembly 140 completes the pass across the element 16 to its trailing edge, the hot roller 38 is retracted from the element 16 and the sledge moves back into the initial position for the next cycle. Alternatively, the sledge assembly 140 may begin the next cycle at the trailing edge of the photosensitive element 16 traversing towards the leading edge of the element. In this case, the trailing edge of the element 16 would be clamped to the base member 19 (and the leading edge released from the other clamp system), and the development material may be advanced the length of the element 16. The cycle of the steps of heating the element 16 and contacting the softened photopolymer with an development material can be repeated as many times as necessary to adequately remove the uncured material and create sufficient relief depth.

Photosensitive Element

The present invention is not limited to the type of element that is thermally processed. In one embodiment, the photosensitive element 16 includes a flexible substrate and a composition layer mounted on the substrate. The composition layer is at least one layer on the substrate capable of being partially liquefied. Preferably, the photosensitive element 16 is an elastomeric printing element suitable for use as a flexographic printing form. The at least one layer on the substrate is preferably a photosensitive layer, and most preferably a photopolymerizable layer of an elastomeric composition wherein the photosensitive layer can be selectively cured by actinic radiation. As used herein, the term "photopolymerizable" encompasses systems that are photopolymerizable, photocrosslinkable, or both. In cases where the composition layer comprises more than one photosensitive layer on the flexible substrate, the composition of each of the photosensitive layers can be the same or different from any of the other photosensitive layers.

The layer of the photosensitive composition is capable of partially liquefying upon thermal development. That is, during thermal development the uncured composition must soften or melt at a reasonable processing or developing temperature. At least the exterior surface of the composition layer is heated to a temperature sufficient to cause a portion of the layer to liquefy, soften or melt.

The photosensitive layer includes at least one monomer and a photoinitiator, and optionally a binder. The at least one monomer is an addition-polymerizable ethylenically unsaturated compound with at least one terminal ethylenic group. Monomers that can be used in the photosensitive layer are well known in the art and include monofunctional acrylates and methacrylates, multifunctional acrylates and methacrylates, and polyacryloyl oligomers. Further examples of monomers can be found in U.S. Pat. Nos. 4,323,636; 4,753,865; and 4,726,877. A mixture of monomers may be used.

The photoinitiator is a compound that generates free radicals upon exposure to actinic radiation. Any of the known classes of photoinitiators, particularly free radical photoinitiators may be used. Alternatively, the photoinitiator may be a mixture of compounds, one of which provides the free radicals when caused to do so by a sensitizer activated by radiation.

The optional binder is a preformed polymer that serves as a matrix for the monomer and photoinitiator prior to exposure and is a contributor to the physical properties of the photopolymer both before and after exposure. In one embodiment the optional binder is elastomeric. A non-limiting example of an elastomeric binder is an A-B-A type block copolymer, where A represents a nonelastomeric block, preferably a vinyl polymer and most preferably polystyrene, and B represents an elastomeric block, preferably polybutadiene or polyisoprene. Other suitable photosensitive elastomers that may be used include polyurethane elastomers, such as those described in U.S. Pat. Nos. 5,015,556 and 5,175,072. The monomer or mixture of monomers must be compatible with the binder to the extent that a clear, non-cloudy photosensitive layer is produced.

Additional additives to the photosensitive layer include colorants, processing aids, antioxidants, and antiozonants. Processing aids may be such things as low molecular weight polymers compatible with the elastomeric block copolymer. Antiozonants include hydrocarbon waxes, norbornenes, and vegetable oils. Suitable antioxidants include alkylated phenols, alkylated bisphenols, polymerized trimethyldihydroquinone, and dilauryl thiopropinoate.

The photosensitive element may include one or more additional layers on the side of the photosensitive layer opposite the substrate. Examples of additional layers include, but are not limited to, a release layer, a capping layer, an elastomeric layer, a laser radiation-sensitive layer, a barrier layer, and combinations thereof. The one or more additional layers preferably are removable, in whole or in part, by contact with the development material in the range of acceptable developing temperatures for the photosensitive element used. One or more of the additional other layers can cover or only partially cover the photosensitive composition layer. An example of an additional layer which only partially covers the photosensitive composition layer is a masking layer that is formed by imagewise application, e.g., ink jet application, of an actinic radiation blocking material or ink.

The release layer protects the surface of the composition layer and enables the easy removal of a mask used for the imagewise exposure of the photosensitive element. Materials suitable as the release layer are well known in the art. Suitable compositions for the capping layer and methods for forming the layer on the element are disclosed as elastomeric compositions in a multilayer cover element described in Gruetzmacher et al., U.S. Pat. Nos. 4,427,759 and 4,460,675. The elastomeric capping layer is similar to the photosensitive layer in that after imagewise exposure the elastomeric capping layer is at least partially removable by contact with the development material in the range of acceptable temperatures for the photosensitive element used.

In one embodiment, the laser radiation sensitive layer is sensitive to infrared laser radiation, and thus may be identified as an infrared-sensitive layer. The laser radiation sensitive layer can be on the photosensitive layer, or on a barrier layer which is on the photosensitive layer, or on a temporary support which together with the photosensitive element form an assemblage. Each of the release layer and elastomeric capping layer can function as the barrier layer when the release and/or capping layer/s is disposed between the infrared-sensitive layer and the photosensitive layer. The infrared-sensitive layer can be ablated (i.e., vaporized or removed) from the photosensitive layer on the side opposite the flexible substrate by exposure to infrared laser radiation. Alternatively, when the photosensitive element forms an assemblage with the support carrying the infrared-sensitive layer, the infrared-sensitive layer can be transferred from the temporary support to the external surface (the side opposite the flexible substrate) of the photosensitive layer by exposure to infrared laser radiation. The infrared-sensitive layer can be used alone or with other layers, e.g., ejection layer, heating layer, etc.

The infrared-sensitive layer generally comprises an infrared-absorbing material, a radiation-opaque material, and an optional binder. Dark inorganic pigments, such as carbon black and graphite, generally function as both infrared-sensitive material and radiation-opaque material. The thickness of the infrared-sensitive layer should be in a range to optimize both sensitivity and opacity to actinic radiation (e.g., has an optical density of $\geq 2.5$). Such infrared-sensitive photoablative or phototransferable layer can be employed in digital direct-to-plate image technology in which the exposure by laser radiation removes or transfers the infrared-sensitive layer to form an in-situ mask on the photosensitive element. Suitable infrared-sensitive compositions, elements, and their preparation are disclosed in U.S. Pat. No. 5,262,275; U.S. Pat. No. 5,719,009; U.S. Pat. No. 5,607,814; U.S. Pat. No. 5,506,086; U.S. Pat. No. 5,766,819; U.S. Pat. No. 5,840,463; and EP 0 741 330 A1. The infrared-sensitive layer preferably is removable by contact with an development material in the range of acceptable developing temperatures for the photosensitive element used.

The photosensitive element of the present invention may further include a temporary coversheet on top of the uppermost layer of the photosensitive element. One purpose of the coversheet is to protect the uppermost layer of the photosensitive element during storage and handling. Depending upon end use, the coversheet may or may not be removed prior to imaging, but is removed prior to development. Suitable materials for the coversheet are well known in the art.

The substrate is selected to be tear resistant and must have a fairly high melt point, for example, above the liquefying temperature of the composition layer formed on the substrate. The material for the substrate is not limited and can be selected from polymeric films, foams, fabrics, and metals such as aluminum and steel. The substrate can be almost any polymeric material that forms films that are non-reactive and remain stable throughout the processing conditions. Examples of suitable film supports include cellulosic films and thermoplastic materials such as polyolefins, polycarbonates, and polyester.

The substrate of the photosensitive element has a thickness of between about 0.01 mm and about 0.38 mm. The radiation curable composition layer is between about 0.35 mm and about 7.6 mm thick, with a preferred thickness of about 0.5 mm to 3.9 mm (20 to 155 mils).

The photosensitive element 16 is prepared for thermal development by imagewise exposing the element 16 to actinic radiation. After imagewise exposure, the photosensitive element 16 contains cured portions in the exposed areas of the radiation curable composition layer and uncured portions in the unexposed areas of the radiation curable composition layer. Imagewise exposure is carried out by exposing the photosensitive element through an image-bearing mask. The image-bearing mask may be a black and white transparency or negative containing the subject matter to be printed, or an in-situ mask formed with the laser radiation sensitive layer on the composition layer, or other means known in the art.

Imagewise exposure can be carried out in a vacuum frame or may be conducted in the presence of atmospheric oxygen. On exposure, the transparent areas of the mask allow addition polymerization or crosslinking to take place, while the actinic radiation opaque areas remain uncrosslinked. Exposure is of sufficient duration to crosslink the exposed areas down to the support or to a back exposed layer (floor). Imagewise exposure time is typically much longer than backflash time, and ranges from a few to tens of minutes.

For direct-to-plate image formation as disclosed in U.S. Pat. No. 5,262,275; U.S. Pat. No. 5,719,009; U.S. Pat. No. 5,607,814; U.S. Pat. No. 5,506,086; U.S. Pat. No. 5,766,819; U.S. Pat. No.. 5,840,463 and EP 0 741 330 A1 the image-bearing mask is formed in-situ with the laser radiation sensitive layer using an infrared laser exposure engine. The imagewise laser exposure can be carried out using various types of infrared lasers, which emit in the range 750 to 20,000 nm, preferably in the range 780 to 2,000 nm. Diode lasers may be used, but Nd:YAG lasers emitting at 1060 nm are preferred.

Actinic radiation sources encompass the ultraviolet, visible and infrared wavelength regions. The suitability of a particular actinic radiation source is governed by the photosensitivity of the initiator and the at least one monomer used in preparing the flexographic printing plates from the photosensitive element. The preferred photosensitivity of most common flexographic printing plates is in the UV and deep visible area of the spectrum, as they afford better room-light stability. The portions of the composition layer that are exposed to radiation chemically cross-link and cure. The portions of the composition layer that are unirradiated (unexposed) are not cured and have a lower melting or liquefying temperature than the cured irradiated portions. The imagewise exposed photosensitive element 16 is then ready for heat development with the development material to form a relief pattern.

An overall back exposure, a so-called backflash exposure, may be conducted before or after the imagewise exposure to polymerize a predetermined thickness of the photopolymer layer adjacent the support. This polymerized portion of the photopolymer layer is designated a floor. The floor thickness varies with the time of exposure, exposure source, etc. This exposure may be done diffuse or directed. All radiation sources suitable for imagewise exposure may be used. The exposure is generally for 10 seconds to 30 minutes.

Following overall exposure to UV radiation through the mask, the photosensitive printing element is thermally developed as described above to remove unpolymerized areas in the photopolymerizable layer and thereby form a relief image. The thermal development step removes at least the photopolymerizable layer in the areas which were not exposed to actinic radiation, i.e., the unexposed areas or uncured areas, of the photopolymerizable layer. Except for the elastomeric capping layer, typically the additional layers that may be present on the photopolymerizable layer are removed or substantially removed from the polymerized areas of the photopolymerizable layer.

An development material or medium is selected having a melt temperature exceeding the melt or softening or liquefying temperature of the unirradiated or uncured portions of the radiation curable composition and having good tear resistance at the same operating temperatures. Preferably, the selected material withstands temperatures required to process the photosensitive element during heating. The development medium is selected from non-woven materials, paper stocks, fibrous woven material, open-celled foam materials, porous materials that contain more or less a substantial fraction of their included volume as void volume. The development medium can be in web or sheet form. The development medium should also possess a high absorbency for the molten elastomeric composition as measured by the grams of elastomer that can be absorbed per square millimeter of the development medium. It is also desirable that fibers are bonded in an development medium so that the fibers are not deposited into the plate during development. A non-woven nylon web is preferred.

After thermal development, the flexographic printing form may be post exposed and/or chemically or physically aftertreated in any sequence to detackify the surface of the flexographic printing form.

What is claimed is:

1. An apparatus for forming a relief pattern from a photosensitive element having an exterior surface and containing a composition layer capable of being partially liquefied comprising:

means for supplying a development medium to the exterior surface;

a base member mounted in a frame portion and positioned for delivering the photosensitive element to the development medium;

a flexible support member removably mounted on the base member;

means for heating the exterior surface to a temperature sufficient to cause a portion of the layer to liquefy; and means for contacting the photosensitive element and the development medium to allow at least a portion of the liquefied material of the composition layer to be absorbed by the development medium.

2. The apparatus of claim 1 wherein the base member is a drum.

3. The apparatus of claim 2 further comprising means for tensioning the flexible support member to the drum.

4. The apparatus of claim 1 wherein the flexible support member comprises a carrier having on an exterior surface a layer selected from the group consisting of a resilient layer, a tacky layer, a protective layer, a resilient and tacky layer, and combinations thereof.

5. The apparatus of claim 1 wherein the base member is a planar support.

6. The apparatus of claim 1 wherein the flexible support member comprises an aluminum sheet having a layer of silicone rubber on one side and a tacky layer on the silicone rubber layer.

7. The apparatus of claim 1 further comprising means for separating the photosensitive element from the development medium.

8. The apparatus of claim 1 wherein the means for contacting further comprises means for pressing the photosensitive element and the development medium into contact at a pressure sufficient for at least a portion of the liquefied material of the composition layer to be absorbed by the development medium.

9. The apparatus of claim 1 wherein the means for heating is selected from the group consisting of a first heating means for applying heat to the exterior surface of the composition layer adjacent where the development medium contacts the layer, the first heating means adapted to heat the exterior surface of the layer;

a second heating means for heating the supplying means to a temperature capable of heating the exterior surface of the composition layer while the development medium is contacting the exterior surface of the layer;

a third heating means for heating the base member to a temperature capable of heating the exterior surface of the composition layer;

a combination of the first heating means and the second heating means;

a combination of the first heating means and the third heating means;

a combination of the second heating means and the third heating means; and a combination of the first heating means, the second heating means and the third heating means.

10. The apparatus of claim 1 wherein the flexible support member includes a means for carrying the photosensitive element.

11. The apparatus of claim 1 wherein the flexible support member has two sides and has at least one layer of a modification material on each side.

12. The apparatus of claim 1 further comprising one or more additional support members mounted adjacent to the flexible support member.

13. The apparatus of claim 1 wherein the flexible support member is in sheet form or cylindrical form.

14. The apparatus of claim 1 wherein the flexible support member comprises a self-supporting material.

* * * * *

UNITED STATES PATENT AND TRADEMARK OFFICE
CERTIFICATE OF CORRECTION

PATENT NO. : 7,398,812 B2  
APPLICATION NO. : 11/009679  
DATED : July 15, 2008  
INVENTOR(S) : Mark A. Hackler et al.

Page 1 of 1

It is certified that error appears in the above-identified patent and that said Letters Patent is hereby corrected as shown below:

Title Page, item (75) Inventors:
   Please change the addresses for the following inventors:
      "Dietmar Dudek, Langen, DE (US)" to -- Dietmar Dudek, Langen, DE (GERMANY) --.

"Pier Luigi Sassanelli, Neu-Isenburg, DE (US)" to -- Pier Luigi Sassanelli, Neu-Isenburg, DE (GERMANY) --.

Signed and Sealed this

Second Day of September, 2008

JON W. DUDAS  
*Director of the United States Patent and Trademark Office*